United States Patent
Takahashi et al.

(10) Patent No.: US 10,492,306 B2
(45) Date of Patent: Nov. 26, 2019

(54) CIRCUIT BOARD AND METHOD FOR MANUFACTURING SAME

(71) Applicant: KURARAY CO., LTD., Kurashiki-shi (JP)

(72) Inventors: Takeshi Takahashi, Kamisu (JP); Takahiro Nakashima, Kamisu (JP); Minoru Onodera, Saijo (JP); Tetsuya Hara, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 195 days.

(21) Appl. No.: 15/583,331

(22) Filed: May 1, 2017

(65) Prior Publication Data

US 2017/0238428 A1 Aug. 17, 2017

Related U.S. Application Data

(63) Continuation of application No. PCT/JP2015/080743, filed on Oct. 30, 2015.

(30) Foreign Application Priority Data

Nov. 7, 2014 (JP) .................................. 2014-227321

(51) Int. Cl.
*H01K 3/22* (2006.01)
*H05K 3/46* (2006.01)
(Continued)

(52) U.S. Cl.
CPC ........... *H05K 3/4632* (2013.01); *B32B 15/08* (2013.01); *B32B 38/0036* (2013.01);
(Continued)

(58) Field of Classification Search
CPC ...... H05K 3/4632; H05K 3/10; H05K 3/4635; H05K 1/0313; H05K 1/0393;
(Continued)

(56) References Cited

U.S. PATENT DOCUMENTS 5,719,354 A * 2/1998 Jester .................. H05K 3/4617
174/255
6,616,796 B1 9/2003 Onodera et al.
(Continued)

FOREIGN PATENT DOCUMENTS

CN 1914964 A 2/2007
JP 11-309803 11/1999
(Continued)

OTHER PUBLICATIONS

Extended European Search Report dated Jul. 4, 2018 in Patent Application No. 15856520.0.
(Continued)

*Primary Examiner* — Donghai D Nguyen
(74) *Attorney, Agent, or Firm* — Oblon, McClelland, Maier & Neustadt, L.L.P.

(57) ABSTRACT

Provided are circuit board excellent in interlayer adhesion and solder heat resistance, and production method thereof. The circuit board is produced by a method including: preparing a plurality of at least one kind of thermoplastic liquid crystal polymer (TLCP) films, forming a conductor layer on one side or both sides of a film in at least one of the films to obtain a unit circuit board, laminating the films containing the unit circuit board to obtain a stacked material, conducting thermo-compression-bonding of the stacked material under pressurization to a first temperature giving an interlayer adhesion to integrate the stacked material, carrying out structure-controlling thermal treatment by heating the integrated stacked material at a second temperature which is lower than the first temperature and is lower than a melting point of a TLCP having a lowest melting point out of the plurality of TLCP films.

10 Claims, 2 Drawing Sheets

(51) Int. Cl.
  H05K 1/03  (2006.01)
  H05K 3/10  (2006.01)
  B32B 15/08  (2006.01)
  B32B 38/00  (2006.01)
  B29C 65/00  (2006.01)
  B29C 65/02  (2006.01)
  B29L 31/34  (2006.01)

(52) U.S. Cl.
  CPC ......... *H05K 1/0313* (2013.01); *H05K 1/0393* (2013.01); *H05K 3/10* (2013.01); *H05K 3/4635* (2013.01); *B29C 65/02* (2013.01); *B29C 66/034* (2013.01); *B29C 66/1122* (2013.01); *B29C 66/45* (2013.01); *B29C 66/7352* (2013.01); *B29C 66/7392* (2013.01); *B29C 66/73921* (2013.01); *B29C 66/742* (2013.01); *B29C 66/91411* (2013.01); *B29C 66/91445* (2013.01); *B29C 66/91933* (2013.01); *B29L 2031/3425* (2013.01); *H05K 2201/0129* (2013.01); *H05K 2201/0141* (2013.01); *H05K 2201/0355* (2013.01); *H05K 2203/0278* (2013.01); *H05K 2203/111* (2013.01); *H05K 2203/1178* (2013.01); *H05K 2203/1194* (2013.01)

(58) Field of Classification Search
  CPC ... H05K 2203/1178; H05K 2203/1194; H05K 2201/0141; B32B 15/08; B32B 38/0036; B29C 66/7392; B29C 66/73921; B29C 66/034; Y10T 29/49155
  USPC .................................................. 29/846, 851
  See application file for complete search history.

(56) References Cited

U.S. PATENT DOCUMENTS

| | | | |
|---|---|---|---|
| 7,549,220 | B2 | 6/2009 | Roseen, Jr. et al. |
| 7,811,408 | B2 * | 10/2010 | Onodera ............. B29C 66/1122 |
| | | | 156/308.2 |
| 9,439,303 | B2 | 9/2016 | Onodera et al. |
| 2005/0132566 | A1 | 6/2005 | Roseen, Jr. et al. |
| 2008/0107833 | A1 | 5/2008 | Onodera et al. |
| 2010/0323210 | A1 | 12/2010 | Onodera et al. |
| 2015/0195921 | A1 | 7/2015 | Onodera et al. |

FOREIGN PATENT DOCUMENTS

| | | |
|---|---|---|
| JP | 2000-263577 | 9/2000 |
| JP | 2000-343610 | 12/2000 |
| JP | 2007-515069 | 6/2007 |
| JP | 2010-103269 | 5/2010 |
| WO | WO 2005/069708 A1 | 7/2005 |
| WO | WO 2014/046014 A1 | 3/2014 |

OTHER PUBLICATIONS

Combined Chinese Office Action and Search Report dated Sep. 30, 2018 in Chinese Patent Application No. 201580060074.7 (with English translation of Search Report only), 6 pages.
International Search Report dated Feb. 2, 2016 in PCT/JP2015/080743 filed Oct. 30, 2015 (with English translation).
Office Action dated Feb. 19, 2019 in Japanese Patent Application No. 2016-557743 (with unedited computer generated English translation).

* cited by examiner

CIRCUIT BOARD AND METHOD FOR MANUFACTURING SAME

CROSS REFERENCE TO THE RELATED APPLICATIONS

This application is a continuation application, under 35 U.S.C. § 111(a), of international application No. PCT/JP2015/080743, filed Oct. 30, 2015, which claims Convention priority to Japanese patent application No. 2014-227321, filed Nov. 7, 2014, the entire disclosure of which is herein incorporated by reference as a part of this application.

FIELD OF THE INVENTION

The present invention relates to a laminated circuit board which is excellent in interlayer adhesion and solder heat resistance, and a production method thereof.

BACKGROUND ART

In general electronic equipment, such as an information processing device and a communication device, comprises a circuit board. The circuit board usually has a substrate of an insulating material, and a layer of an electrical conducting material (hereinafter referred to as a conductor layer) formed on the substrate. The conductor layer is used to form a circuit. Various kinds of electronic parts are installed on the circuit board by processing of soldering etc.

As for the circuit board used for small electronic equipment, such as a mobile phone, requirements of downsizing and thinning advance development of a circuit board with an insulating substrate of a flexible resin material. Lately multilayered circuit boards with a plurality of conductor layers have been also widely used.

As a flexible insulating material, thermoplastic liquid crystal polymer film attracts attention in recent years. In laminated circuit boards, thermoplastic liquid crystal polymer films are used as an insulating substrate for a conductor circuit board, as a bonding sheet which binds unit circuit boards, each of which has a conductor circuit formed on the substrate surface, as a coverlay film formed on the surface of the circuitry layer, and so on. These thermoplastic liquid crystal polymer films can constitute a laminated circuit board without using adhesives, since these films can be bonded with each other by thermo-compression-bonding heated under pressurization.

Laminated circuit boards, which use a thermoplastic liquid crystal polymer film as an insulating substrate, have been variously improved. For example, Patent Document 1 (JP Laid-open Patent Publication No. 2000-343610) describes a production method of a metal-clad laminate for circuit boards, the method comprising a first process of roll-to-roll-bonding a thermoplastic liquid crystal polymer film having a predetermined degree of molecular orientation to a metal sheet between heating rollers under a strain state to obtain an integrated laminate sheet, and a second process of heat-treating the laminate sheet at a temperature above the melting point of the thermoplastic liquid crystal polymer film.

Patent Document 2 (JP Laid-open Patent Publication No. 2010-103269) discloses a method for producing a multilayer circuit board including: softening at least one surface of a thermoplastic liquid crystal polymer film by physical grinding or UV radiation to form an adhesive surface, counterposing the adhesive surface on a circuit surface of a wiring substrate comprising a conductor circuit, and carrying out a thermo-compression-bonding of the entire components.

SUMMARY OF THE INVENTION

Patent Document 1 describes that a metal-clad laminate excellent in isotropy and a dimensional stability is provided by bonding the thermoplastic liquid crystal polymer film having the predetermined degree of molecular orientation to the metal sheet under a strain state, followed by heating them at the temperature higher than the melting point of the film. However, Patent Document 1 is silent on solder heat resistance or dimensional stability at the time of laminating and thermo-compression-bonding of two or more thermoplastic liquid crystal polymer films.

Patent Document 2 describes that softening processing to the surface of a thermoplastic liquid crystal polymer film can improve adhesiveness even without performing surface roughening processing by means of chemical substance or plasma so as to achieve solder resistance and dimensional stability. However, the method described in Patent Document 2 is not suitable for mass production of laminated circuit boards, because the method requires processing of adhesion surface by polish or an ultraviolet exposure. The method also imposes design restrictions of lamination structure.

An object of the present invention is to provide a circuit board excellent in interlayer adhesion and solder heat resistance, and a production method thereof by a simple method using heat treatment. Another object of the present invention is to provide a circuit board being excellent in interlayer adhesion and solder heat resistance, as well as having a small dimensional change in a manufacturing process, and a production method thereof.

A first aspect of the present invention is a production method of a circuit board, the method includes: preparing a plurality of at least one kind of thermoplastic liquid crystal polymer films, forming a conductor layer on one side or both sides of a film in at least one of the plurality of films to obtain a unit circuit board, laminating the plurality of films containing the unit circuit board to obtain a stacked material, conducting thermo-compression-bonding of the stacked material under pressurization to a first temperature (adhesion temperature) giving an interlayer adhesion to integrate the stacked material, carrying out structure-controlling thermal treatment by heating the integrated stacked material for a predetermined period at a second temperature which is lower than the first temperature and lower than a melting point of a thermoplastic liquid crystal polymer having a lowest melting point in a film body of the plurality of thermoplastic liquid crystal polymer film.

Here, the structure-controlling thermal treatment is a heat treatment carried out in order to control molecular structure of thermoplastic liquid crystal polymer in the film. The second temperature is a temperature at which the molecular structure of thermoplastic liquid crystal polymer in the film can be controlled by heat treatment.

In the above-described method, a plurality of films may consist of two or more kinds of thermoplastic liquid crystal polymer films having a similar melting point with each other, preferably being a similar formulation, or may consist of two or more kinds of thermoplastic liquid crystal polymer films having different melting points with each other. A conductor layer (conducting layer) may consist of a metallic foil, for example, a copper foil. The conductor layer can may be formed on at least one side of a thermoplastic liquid crystal polymer film, for example, by thermo-compressionbonding a metallic foil (for example, a copper foil) to the thermoplastic liquid crystal polymer film.

In the above-mentioned method, structure-controlling thermal treatment may be a post-heating process carried out after the interlayer adhesion at the first temperature in the thermo-compression-bonding process. In this case, the thermo-compression-bonding process may include the structure-controlling thermal treatment. The structure-controlling thermal treatment may be a process of carrying out structure-controlling thermal treatment, while pressurizing the integrated stacked material. In this case, the thermo-compression-bonding process may include heating a stacked material under pressurization to a first temperature, holding the temperature for a predetermined period, and cooling the temperature to a second temperature to carry out the structure-controlling thermal treatment.

Where a thermoplastic liquid crystal polymer film having a lowest melting point in the stacked material has a melting point of TmL, the thermo-compression-bonding may be carried out at a first temperature of, for example, (TmL−35)° C. to (TmL+20)° C.; and/or the structure-controlling thermal treatment may be carried out at a second temperature that is equal to or lower than the temperature of 10° C. lower than the first temperature. From the first temperature to the second temperature, cooling may be carried out at a cooling rate of 1° C./minute to 8° C./minute, preferably at a cooling rate of 2° C./minute to 8° C./minute.

For example, the structure-controlling thermal treatment at the second temperature may be carried out for 15 minutes to 90 minutes. Further, the thermo-compression-bonding at the first temperature may be carried out for 15 minutes to 60 minutes.

In the above-mentioned method, the adhesion temperature for thereto-compression-bonding (the first temperature) may be 270 to 320° C., and/or the temperature (the second temperature) for structure-controlling thermal treatment may be 260° C. to 290° C. The press pressure at the time of thermo-compression-bonding may be 5 MPa or lower.

In the above-mentioned method, the integrated stacked material may be a laminate having a plurality of unit circuit boards each of which has a thermoplastic liquid crystal polymer film and a conductor layer formed on at least one surface thereof. Alternatively, the integrated stacked material may be a laminate including one or a plurality of unit circuit boards, and one or a plurality of thermoplastic liquid crystal polymer film as a single body (a thermoplastic liquid crystal polymer film without a conductor layer on the surface).

For example, the integrated stacked material formed by the above-mentioned method has a part in which a unit circuit board of a thermoplastic liquid crystal polymer film and a conductor layer formed on one surface or both surfaces of the thermoplastic liquid crystal polymer film (a first unit circuit board) is directly bonded to another unit circuit board of a thermoplastic liquid crystal polymer film and a conductor layer formed on one surface or both surfaces of the thermoplastic liquid crystal polymer film (a second unit circuit board).

The integrated stacked material formed by the above-mentioned method has a part in which a bonding sheet of a thermoplastic liquid crystal polymer film is interposed between two unit circuit boards each of which having a thermoplastic liquid crystal polymer film and a conductor layer formed on one surface or both surfaces of the thermoplastic liquid crystal polymer film.

In the above-mentioned method, a degassing process may be carried out in at least one stage selected from the group consisting of a stage after preparing a thermoplastic liquid crystal polymer film and before forming a conductor layer thereon, a stage after forming a conductor layer on one surface or both surfaces of the prepared thermoplastic liquid crystal polymer film, and before forming a stacked material, and a stage after forming the stacked material and before compression-bonding. The degassing process may be carried out for a predetermined period under heating at a temperature ranging from 100° C. to 200° C. under atmospheric or inert gas and/or may be carried out for a predetermined period under vacuum of 1500 Pa or lower.

A second aspect of the present invention is a circuit board produced by the above-mentioned method according to the present invention, having an integrated lamination structure of a plurality of thermoplastic liquid crystal polymer films and at least one conductor layer to be processed into a circuit, the integrated lamination structure including at least a part in which the circuit-processed conductor layer is interposed between the two sheets of the thermoplastic liquid crystal polymer films. This circuit board may be a multilayered circuit board containing two or more conductor layers.

The present invention encompasses any combination of at least two features disclosed in the claims and/or the specification and/or the drawings. In particular, any combination of two or more of the appended claims should be equally construed as included within the scope of the present invention.

According to the production method of the circuit board concerning the present invention, the circuit board excellent in solder heat resistance and peeling resistance can be provided. Further, the circuit board which is also excellent in dimensional stability at the time of heat treatment can be provided.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention. In any way whatsoever, which scope is to be determined by the appended claims. In the accompanying drawings, like reference numerals are used to denote like parts throughout the several views.

DESCRIPTION OF THE EMBODIMENTS

Figure 1:
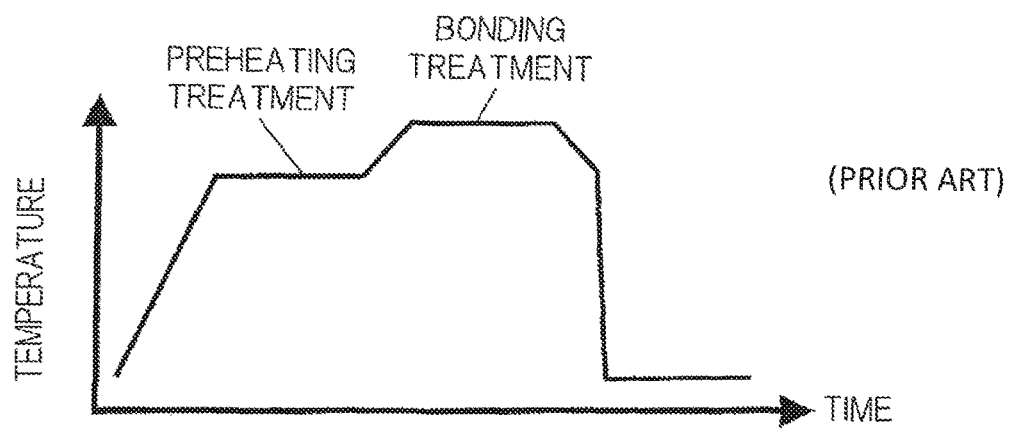
FIG. 1 is a schematic view showing the heat history of the thermo-compression-bonding process in conventional technology.

The production method of a circuit board according to the present invention includes: preparing a plurality of at least one kind of thermoplastic liquid crystal polymer films, forming a conductor layer on one side or both sides of a film out of at least the plurality of films to obtain a unit circuit board, laminating the plurality of films at least containing the unit circuit board to obtain a stacked material, conducting thermo-compression-bonding of the stacked material under pressurization to a first temperature giving an interlayer adhesion to integrate the stacked material, carrying out structure-controlling thermal treatment by heating the integrated stacked material for a predetermined period at a second temperature which is lower than the first temperature and is lower than a lowest melting point of a thermoplastic liquid crystal polymer film having the lowest melting point in a film body of the plurality of thermoplastic liquid crystal polymer films. The circuit board according to the present invention is a circuit board produced by the method according to the present invention.

As the results of intensive study by the inventors of the present invention to develop a laminated circuit board having improved interlayer adhesion as well as solder heat resistance, the inventors found that during the process for producing a laminated circuit board, high treatment temperature in the thermo-compression-bonding process contributed to comparatively high interlayer adhesion, i.e., the higher peel strength between layers, but also found that the higher the maximum temperature in thermo-compression-bonding was, the lower dimensional stability and solder heat resistance were. The inventors continued to develop their research in order to solve this problem, and have found that differing from the conventional method carrying out monotonous cooling of the laminated material from the maximum temperature in the thermo-compression-bonding process, where a structure-controlling thermal treatment is carried out at a specific temperature after holding the laminated material for a predetermined period at the first temperature for interlayer adhesion, it is possible to produce a laminated circuit board excellent in peel strength between layers while maintaining high solder heat resistance, and further having improved dimensional stability, and finally have completed the present invention. Hereinafter, the method according to the present invention will be explained more concretely.

Thermoplastic Liquid Crystal Polymer Film

The thermoplastic liquid crystal polymer film (hereinafter may be referred to as TLCP film), which constitutes a film body is formed from a liquid crystalline polymer that can be melt-processable. The thermoplastic liquid crystal polymer is a polymer capable of forming an optically anisotropic melt phase and chemical formulation of the thermoplastic liquid crystal polymer is not particularly limited to a specific one as long as it is a liquid crystalline polymer that can be melt-processable, and examples thereof may include a thermoplastic liquid crystal polyester, or a thermoplastic liquid crystal polyester amide obtained by introducing an amide bond thereto.

Furthermore, the thermoplastic liquid crystal polymer may be a polymer obtained by further introducing, to an aromatic polyester or an aromatic polyester amide, an imide bond, a carbonate bond, a carbodiimide bond, or an isocyanate-derived bond such as an isocyanurate bond.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. However, it is needless to say that, in order to form a polymer capable of forming an optically anisotropic melt phase, there is a suitable range regarding the combination of various raw-material compounds.

(1) Aromatic or aliphatic dihydroxy compounds (see Table 1 for representative examples)

TABLE 1

Chemical structural formulae of representative examples of aromatic or aliphatic dihydroxyl compounds

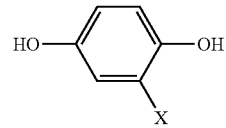

X represents a hydrogen atom or a halogen atom, or a group such as a lower alkyl (e.g., $C_{1-3}$ alkyl) or a phenyl

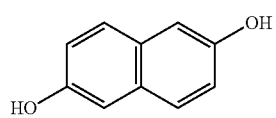

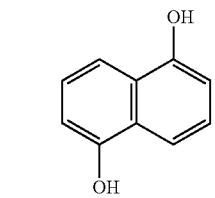 [SMILES: Oc1cccc2c(O)cccc12]

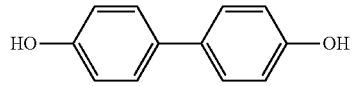

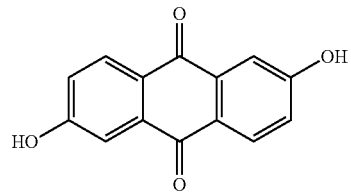 [SMILES: O=C1c2ccc(O)cc2C(=O)c2ccc(O)cc21]

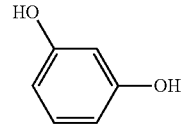

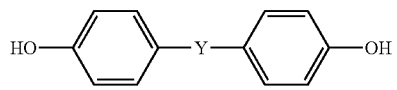

Y represents a group such as —O—, —$CH_2$—, —S—, —CO—, —$C(CH_3)_2$—, or —$SO_2$—

HO($CH_2$)$_n$OH n is an integer of 2 to 12

(2) Aromatic or aliphatic dicarboxylic acids (see Table 2 for representative examples)

TABLE 2

Chemical structural formulae of representative examples of aromatic or aliphatic dicarboxylic acids

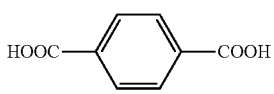

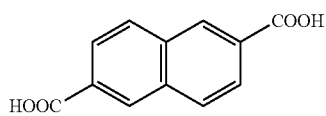 [SMILES: O=C(O)c1ccc2cc(C(=O)O)ccc2c1]

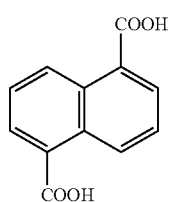 [SMILES: O=C(O)c1cccc2c(C(=O)O)cccc12]

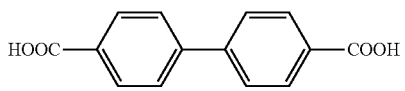

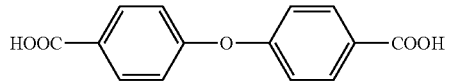

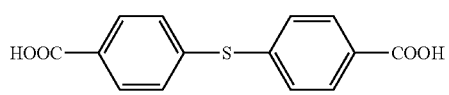 [SMILES: O=C(O)c1ccc(Sc2ccc(C(=O)O)cc2)cc1]

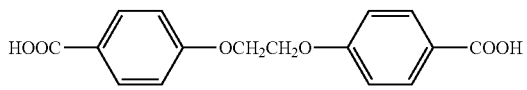

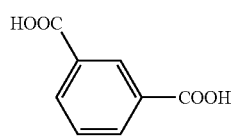

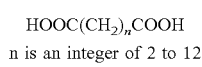

$HOOC(CH_2)_nCOOH$
n is an integer of 2 to 12

(3) Aromatic hydroxycarboxylic acids (see Table 3 for representative examples)

TABLE 3

Chemical structural formulae of representative examples of aromatic or aliphatic hydroxycarboxylic acids

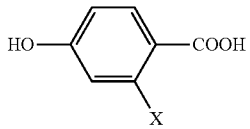

X represents a hydrogen atom or a halogen atom, or a group such as a lower alkyl (e.g., $C_{1-3}$ alkyl) or a phenyl

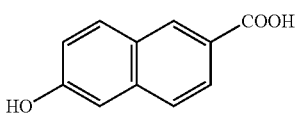 [SMILES: O=C(O)c1ccc2cc(O)ccc2c1]

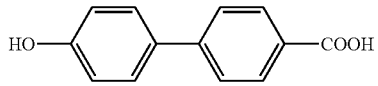 [SMILES: O=C(O)c1ccc(-c2ccc(O)cc2)cc1]

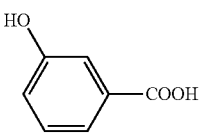

(4) Aromatic diamines, aromatic hydroxy amines, and aromatic aminocarboxylic acids (see Table 4 for representative examples)

TABLE 4

Chemical structural formulae of representative examples of aromatic diamines, aromatic hydroxy amines, or aromatic aminocarboxylic acids

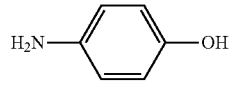

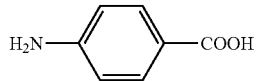

Representative examples of liquid crystal polymers obtained from these raw-material compounds may include copolymers having structural units shown in Tables 5 and 6.

TABLE 5

Representative examples (1) of a thermoplastic liquid crystal polymer

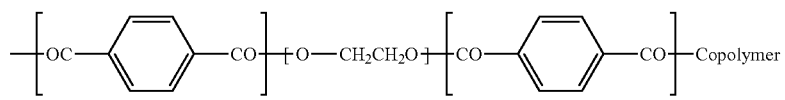

(A)

TABLE 5-continued
Representative examples (1) of a thermoplastic liquid crystal polymer
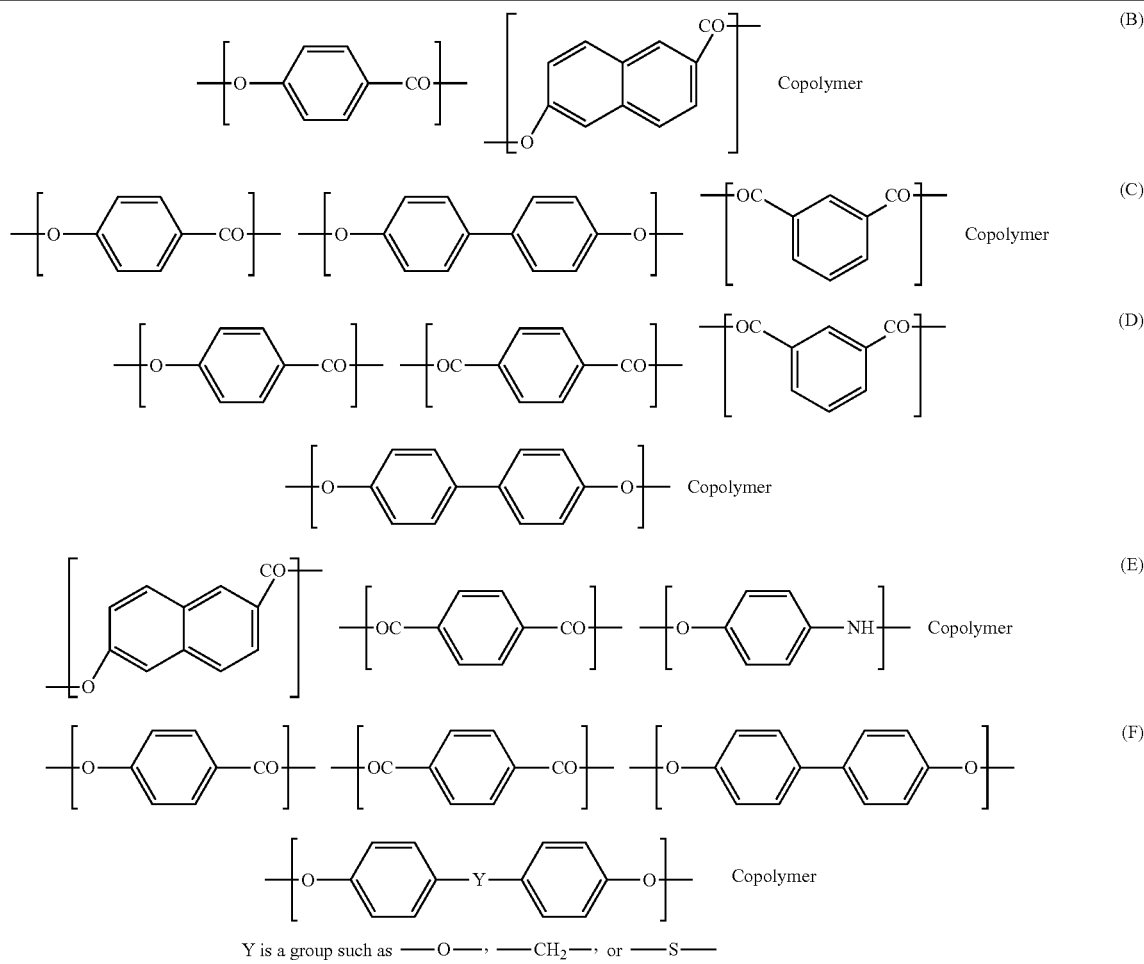
TABLE 6
Representative examples (2) of thermoplastic liquid crystal polymer
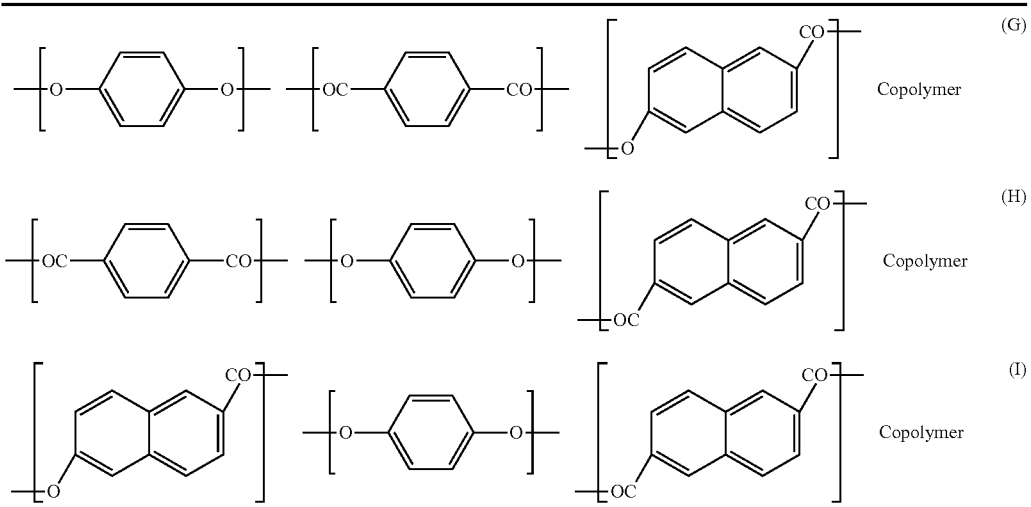

TABLE 6-continued

Representative examples (2) of thermoplastic liquid crystal polymer

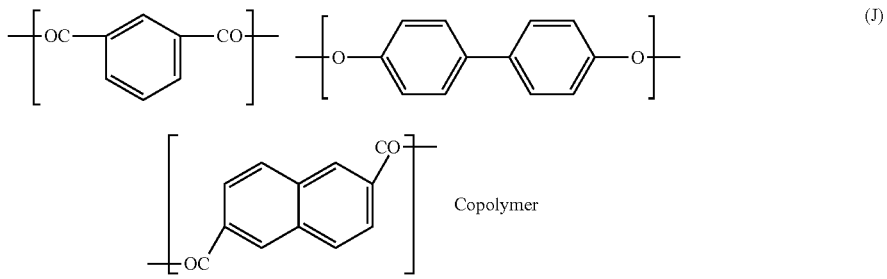

(J) Copolymer

Of these copolymers, polymers including at least p-hydroxybenzoic acid and/or 6-hydroxy-2-naphthoic acid as repeating units are preferable; and particularly preferred polymers include:

a polymer (i) having repeating units of p-hydroxybenzoic acid and 6-hydroxy-2-naphthoic acid, and a polymer (ii) having repeating units of
at least one aromatic hydroxycarboxylic acid selected from a group consisting of p-hydroxybenzoic acid and 6-hydroxy-2-naphthoic acid,
at least one aromatic diol selected from a group consisting of 4,4'-dihydroxybiphenyl and hydroquinone, and
at least one aromatic dicarboxylic acid selected from a group consisting of terephthalic acid, isophthalic acid, and 2,6-naphthalene dicarboxylic acid.

For example, in the case where the polymer (i) comprises a thermoplastic liquid crystal polymer having repeating units of at least p-hydroxybenzoic acid (A) and 6-hydroxy-2-naphthoic acid (B), the liquid crystal polymer may have a mole ratio (A)/(B) of preferably about (A)/(B)=10/90 to 90/10, more preferably about (A)/(B)=50/50 to 85/15, and further preferably about (A)/(B)=60/40 to 80/20.

Furthermore, in the case where the polymer (ii) comprises a liquid crystal polymer having repeating units of at least one aromatic hydroxycarboxylic acid (C) selected from a group consisting of p-hydroxybenzoic acid and 6-hydroxy-2-naphthoic acid, at least one aromatic diol (D) selected from a group consisting of 4,4'-dihydroxybiphenyl and hydroquinone, and at least one aromatic dicarboxylic acid (E) selected from a group consisting of terephthalic acid, isophthalic acid, and 2,6-naphthalene dicarboxylic acid, the liquid crystal polymer may have a mole ratio of aromatic hydroxycarboxylic acid (C):aromatic diol (D):aromatic dicarboxylic acid (E)=30 to 80:35 to 10:35 to 10, more preferably about (C):(D):(E)=35 to 75:32.5 to 12.5:32.5 to 12.5, and further preferably about (C):(D):(E)=40 to 70:30 to 15:30 to 15.

Furthermore, the liquid crystal polymer may have a mole ratio of a repeating structural unit derived from an aromatic dicarboxylic acid relative to a repeating structural unit derived from an aromatic diol of preferably (D)/(E)=95/100 to 100/95. Deviation from this range may tend to result in a low degree of polymerization and deterioration in mechanical strength.

It should be noted that, in the present invention, optical anisotropy in a molten state can be determined by, for example, placing a sample on a hot stage, heating the sample with an elevating temperature under nitrogen atmosphere, and observing light transmitted through the sample.

Preferred thermoplastic liquid crystal polymer has a melting point (hereinafter, referred to as $Tm_0$) in a range from 260° C. to 360° C., and more preferably from 270° C. to 350° C.

As long as the advantageous effect of the present invention is not deteriorated, to the thermoplastic liquid crystal polymer, may be added any thermoplastic polymer such as a polyethylene terephthalate, a modified polyethylene terephthalate, a polyolefin, a polycarbonate, a polyarylate, a polyamide, a polyphenylene sulfide, a polyether ether ketone, and a fluorine resin; and/or various additives. If necessary, a filler may be added to the thermoplastic liquid crystal polymer.

The TLCP film used in the present invention can be obtained by extruding a thermoplastic liquid crystal polymer. As long as the direction of rigid rod-like molecules of the thermoplastic liquid crystal polymer can be controlled, any extrusion method may be applied. In particular, well-known methods such as a T-die method, a laminate-stretching method, and an inflation method (tubular blown film extrusion method) are industrially advantageous. In particular, the inflation method or the laminate-stretching method can apply stresses not only in a machine direction of the film (or the machine processing direction, hereinafter referred to as MID direction), but also in a transverse direction (hereinafter, abbreviated as TD direction) perpendicular to the MD direction. Accordingly, the inflation method or the laminate-stretching method can be advantageously used to obtain a film having controlled properties such as molecular orientation and dielectric characteristics in both the MD and TD directions.

The extrusion molding is preferably accompanied by a stretching treatment in order to control the orientation. For example, in the extrusion molding using a T-die method, a molten polymer sheet extruded from a T-die may be stretched in the MD direction and the TD direction at the same time, alternatively a molten polymer sheet extruded from a T-die may be stretched in sequence, first in the MD direction and then the TD direction.

Also, in the extrusion molding using an inflation method, a tubular sheet being melt-extruded from an annular die may be drawn with a predetermined draw ratio (corresponding to a stretching ratio in the MD direction; also referred to as draw-down ratio) and a predetermined blow ratio (corresponding to a stretching ratio in the TD direction; also referred to as braw-up ratio).

The stretching ratios carried out in such extrusion molding may be, as a stretching ratio in the MD direction (or draw ratio), for example, about 1.0 to 10, preferably about 1.2 to 7, and more preferably 1.3 to 7; and/or as a stretching ratio in the TD direction (or blow ratio), for example, about 1.5 to 20, preferably 2 to about 15, and still more preferably about 2.5 to 14.

The ratio of the TD direction-stretching ratio relative to the MD direction-stretching ratio (TD direction/MD direction), may be, for example, 2.6 or less, preferably about 0.4 to 2.5.

If necessary, the extrusion-molded TLCP film may be subjected to further stretching. The stretching method itself is known, and either biaxial stretching or uniaxial stretching may be employed. From the viewpoint of easy control of molecular orientation, biaxial stretching is preferable. The stretching may be carried out using a known machine such as a uniaxial stretching machine, a simultaneous biaxial stretching machine, and a sequential biaxial stretching machine.

If necessary, a known or conventional heat treatment may be carried out in order to control a melting point and/or thermal expansion coefficient of the TLCP film. Heat treatment conditions can be set appropriately depending on the purpose. The heat treatment may be carried out by heating for hours at a temperature of, for example, $(Tm_0-10)°$ C. or higher, wherein $Tm_0$ denotes a melting point of a liquid crystal polymer, for example, about $(Tm_0-10)°$ C. to $(Tm_0+30)°$ C., and preferably about $Tm_0°$ C. to $(Tm_0+20)°$ C. to increase a melting point (Tm) of the TLCP film.

Thus-obtained TLCP film has improved properties such as dielectric properties, gas barrier properties and low moisture absorption, thus the TLCP film can be suitably used as a circuit board material.

In view of desired heat resistance and processability of the film, the melting point (Tm) of the TLCP film may be selected in a range from about 200° C. to 400° C., preferably about 250° C. to 360° C., more preferably about 260° C. to 350° C. (for example, 260° C. to 340° C.).

The TLCP film used in the present invention may have any thickness. Where the TLCP film is used in a high-frequency transmission line, the TLCP film may have a thickness as thick as possible because usage of a thicker film can reduce transmission loss. Where a TLCP film is used as an electrically insulating layer, the film may preferably have a thickness in a range from 10 to 500 μm, more preferably in a range from 10 to 300 μm, and further preferably in a range from 10 to 200 μm (for example, from 15 to 200 μm). Since a film having too small thickness has small rigidity and poor strength, it is possible to achieve a desired thickness by laminating the films having a thickness in a range from 10 to 200 μm.

Formation of Conductor Layer

The conductor layer is formed on one surface or both surfaces of a TLCP film. The conductor layer is formed from at least conductive metal, and a circuit is formed in this conductor layer using a known circuit processing method. As the method of forming a conductor layer on the insulating substrate of a TLCP film, there may be mentioned a known method, for example, a method of forming a metal layer by means of vapor deposition, as well as a method of forming a metal layer by means of unelectrolytic plating or electrolytic plating. Alternatively, a metallic foil (for example, copper foil) may be thermo-compression-bonded to the surface of the TLCP film.

The metal which constitutes a conductor layer may be preferably a metal used for an electric wiring connection, and may be various metals, such as copper, gold, silver, nickel, and aluminum, preferably copper, and may include an alloy containing the above metal(s) substantially (for example, 98 mass % or more).

Among such metals, metallic foil is preferred, and copper foil is more preferred. The copper foil is not limited to a specific one as long as the copper foil can be used in a circuit board, and may be any of a rolled copper foil and an electrolytic copper foil.

Thermo-compression-bonding of metallic foil may be carried out by applying a pressure in a range about from 3 to 5 MPa at a temperature in a range about from 270 to 320° C. The thermo-compression-bonding may be preferably carried out under an atmosphere, such as an inert gaseous atmosphere, or under vacuum of 1500 Pa or lower. The thermo-compression-bonding can be carried out using a vacuum hot press apparatus, a heating roller equipment, and others.

The conductor layer preferably has a thickness of, for example, 1 to 50 μm, and more preferably 10 to 35 μm.

Circuit processing is performed in at least one conductor layer. The conductor layer (metal layer) may be processed to a circuit using a known method (for example, an etching method using a photograph fabrication). For example, a circuit may be formed using a subtractive process, in which the metal layer (metallic foil) on the TLCP film may be processed by etching. Alternatively, a circuit may be formed using a plating process, in which a seed layer formed on the TLCP film (in this case, the thickness of the seed layer may be less than 1 μm) is plated by a semiadditive process. A conductor circuit may be formed only on one surface of the TLCP film, alternatively may be formed on both surfaces.

The surface of the conductor layer may have an oxidation-resistant coat. In order to enhance the adhesiveness of a conductor layer and a TLCP film, a silane coupling agent may be applied to the conductor layer or the surface of the oxidation-resistant coat on the conductor layer.

Degassing

If necessary, the TLCP film(s) being capable of constituting a stacked material may be subjected to degassing. The degassing process may be carried out (i) under heating at a temperature ranging from 100° C. to 200° C. and/or may be carried out (ii) under vacuum of 1500 Pa or lower.

For example, a degassing process may be carried out under heating at 100° C. to 200° C., followed by under vacuum of 1500 Pa or lower at a temperature in a range from ambient temperature to 200° C. The degassing may be carried out in at least one stage selected from the group consisting of a stage before forming a conductor layer on the surface of the TLCP film, a stage after forming a conductor layer, and a stage after film lamination and before thermo-compression-bonding, alternatively at all stages.

The degassing of a TLCP film may be carried out by heating under atmospheric pressure. The heating may be carried out at a temperature of from 100° C. to 200° C. for a retention time of, for example, from 30 minutes to 4 hours, preferably from about 1 hour to about 3 hours. Where a conductor layer is formed on the surface(s) of the TLCP film, degassing may be preferably carried out under inert-gaseous atmosphere.

Degassing under vacuum conditions is suffice to be carried out at a vacuum degree of 1500 Pa or lower, and preferably 1300 Pa or lower, more preferably 1100 Pa or lower. Degassing under vacuum may be carried out at ambient temperature (around 20° C., for example, 10 to 30° C.), and alternatively by heating up to about 200° C. Degassing under vacuum may be carried out by heating at a temperature in a range about from 100° C. to 200° C. Degassing under vacuum may be carried out for from 30 minutes to about 3 hours. Degassing under vacuum may be carried out after forming a stacked material and before pressurization.

Lamination Process

In the lamination process, a plurality of TLCP films are laminated according to a required design of multilayered circuit board so as to obtain a stacked material. At least one of plurality of TLCP films contains a TLCP film including a conductor circuit formed on at least one surface. Lamination may be carried out outside of the thermocompression bonding apparatus (for example, vacuum hot press apparatus), or may be carried out inside of the above-mentioned apparatus.

In the lamination, two or more unit circuit boards each having a conductor layer may be laminated with each other. Alternatively, a TLCP film used as a bonding sheet may be interposed between two unit circuit boards so as to be laminated. Alternatively, a TLCP film used as a coverlay may be placed on the top and/or bottom of the stacked material.

The TLCP films to be laminated may have a same melting point, or different melting points with each other. For example, the unit circuit board including a high-melting TLCP film and a conductor layer on one surface or both surfaces of the film may be laminated on a low melting point TLCP film used as a bonding sheet or a coverlay.

In the stacked material, difference in melting point between a highest melting point (TmH) TLCP film and a lowest melting point (TmL) TLCP film may be preferably 70° C. or lower (0 to 70° C.). Where TmH is not TmL, two types TLCP films may be used in which difference (TmH–TmL) in melting point between the TLCP films is in a range of, for example, about from 20 to 60° C.

Thermo-Compression-Bonding Process

Subsequently, the stacked material is subjected to the thermo-compression-bonding process by heating and pressurizing so as to be integrated. The thermo-compression-bonding can be carried out, for example, using equipment of a vacuum hot press apparatus, a heating roller lamination apparatus, a double belt press equipment, and other equipment.

In the thermo-compression-bonding, the stacked material is heated under pressurization to a first temperature that causes interlayer adhesion so as to make the stacked material to be integrated. Preferably, the thermo-compression-bonding may be carried out by preheating the stacked material at a certain temperature, followed by heating the stacked material to a first temperature that causes interlayer adhesion and holding the temperature for a predetermined period so as to make the stacked material to be integrated.

The pressure applied to the stacked material in thermo-compression-bonding process may be 5 MPa or less, for example, 0.5 to 2.5 MPa, and preferably 0.7 to 2 MPa.

The first temperature may be suitably set up depending on the melting point of the film. The first temperature (adhesion temperature) at the time of heating may be in a range from (TmL–35)° C. to (TmL+20)° C., preferably from (TmL–20)° C. to (TmL+20)° C., more preferably from (TmL–10)° C. to (TmL+20)° C., still more preferably from (TmL–5)° C. to (TmL+20)° C., and further preferably from TmL° C. to (TmL+15)° C. For example, the first temperature (adhesion temperature) at the time of heating may be in a range from 270° C. to 320° C. The first temperature may be preferably in a range from 280° C. to 310° C., and more preferably in a range from 290° C. to 300° C.

The first temperature can be suitably selected, as long as interlayer adhesion arises in the above-mentioned temperature range, and may be preferably the highest temperature in the heat history in the thermo-compression-bonding process.

The retention time at the adhesion temperature may be about from 15 to 60 minutes, preferably about from 20 to 50 minutes, still more preferably about from 20 to 40 minutes.

In the thermo-compression-bonding process, when heating and pressurizing the stacked material, preheating may be carried out at a temperature in a range about from 100 to 180° C. for a predetermined time, for example, about from 5 to 30 minutes, preferably about from 10 to 20 minutes, before reaching the first temperature arising interlayer adhesion. The preheating can improve circuit filling property.

The thermo-compression-bonding may be preferably carried out under vacuum (for example, 1500 Pa or less). Before pressurizing the stacked material, degassing under vacuum may be carried out as described in the degassing process. For example, the degassing under vacuum may be carried out for a predetermined period at a temperature in a range of about from ambient temperature to 200° C.

Structure-Controlling Thermal Treatment

Subsequently, structure-controlling thermal treatment (thermal treatment for structure control) is carried out by heating the integrated stacked material at a second temperature which is lower than the first temperature and also lower than a lowest melting point of the TLCP film having the lowest melting point among the films in the integrated stacked material. The structure-controlling thermal treatment may be carried out as a process different from the thermo-compression-bonding process after carrying out the thermo-compression-bonding process. Alternatively, structure-controlling thermal treatment may be carried out by adjusting the temperature in the thereto-compression-bonding process by holding for a predetermined period at the first temperature in the heat history of the thereto-compression-bonding process, followed by holding for a predetermined period at the second temperature. In such a case, the structure-controlling thermal treatment may be carried out under the pressure applied to an integrated stacked material in a range of 5 MPa or lower, for example, from 0.5 to 2.5 MPa.

The second temperature is not limited to a specific one as long as the temperature is lower than the first temperature and lower than a lowest melting point of a TLCP film having the lowest melting temperature out of the TLCP films. For example, the second temperature may be (first temperature–10)° C. or lower, and preferably (first temperature–20)° C. or lower. The second temperature may be, with respect to the melting point (TmL) of the film, in a range of from (TmL–30)° C. to (TmL–10)° C., preferably from (TmL–30)° C. to (TmL–15)° C. For example, the second temperature may be in a range from 250 to 300° C., and preferably from 260 to 290° C.

The structure-controlling thermal treatment may be carried out about from 15 minutes to 90 minutes, and preferably about from 30 to 60 minutes. Where the processing time is too short, the effect of the structure-controlling thermal treatment may be not elicited. Where the processing time is too long, the manufacturing efficiency of a circuit board will be deteriorated. From a viewpoint for making the molecular structure easy to control, the structure-controlling thermal treatment may be preferably carried out by holding the temperature range, for example, within 8° C., preferably within 3° C., and particularly preferably within 5° C.

FIG. 1 is a schematic view showing the heat history in the conventional thereto-compression-bonding process. According to the conventional method, a stacked material is heated to a preheating temperature with applying a predetermined pressure, and after reaching the preheating temperature, the stacked material is heated by holding the temperature in the predetermined temperature range for a predetermined period of time. Subsequently, the stacked material is further heated to a first temperature (adhesion temperature) that interlayer adhesion arises, and holding the temperature in the predetermined temperature range for a predetermined period for adhesion processing. Thereafter, the integrated stacked material is cooled under pressure release so as to obtain a laminated circuit board.

Figure 2:
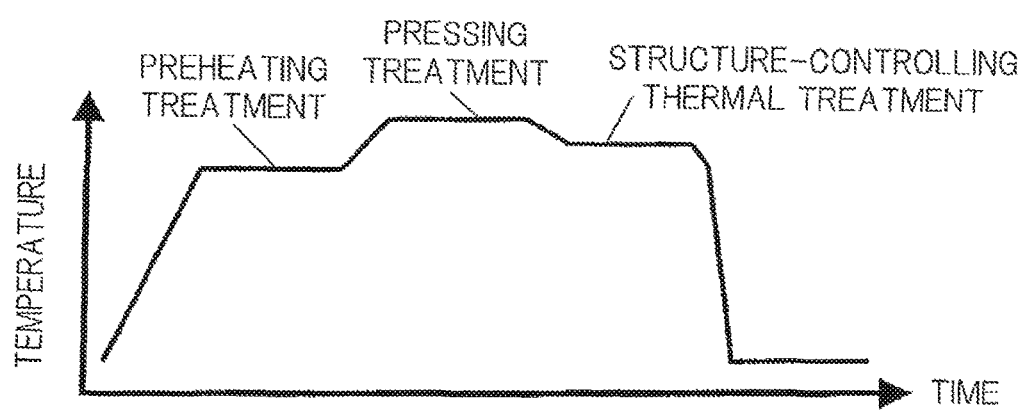
FIG. 2 is a schematic view showing the heat history of the thermo-compression-bonding process accompanied by structure-controlling thermal treatment according to one embodiment of the present invention.

According to one embodiment of the present invention, on the other hand, the structure-controlling thermal treatment may be carried out in the thermo-compression-bonding process as shown in FIG. 2 that is a schematic view showing the heat history in the thermo-compression-bonding process. In this case, a stacked material is compressively heated under a predetermined pressure to a preheating temperature, and after reaching the preheating temperature, the stacked material is heated by holding the temperature in the predetermined temperature range for a predetermined period of time. Subsequently, the stacked material is further heated to a first temperature (adhesion temperature) that interlayer adhesion arises, and holding the temperature in the predetermined temperature range for a predetermined period for adhesion processing. Thereafter, the integrated stacked material is cooled to a second temperature and holding the temperature for a predetermined period for structure-controlling thermal treatment. Then, the integrated stacked material is cooled under pressure release so as to obtain a laminated circuit board.

Heating rate from the preheating temperature to the first temperature and/or cooling rate from the first temperature to the second temperature may be, for example, 1° C./minute to 8° C./minute, and preferably about 2° C./minute to 8° C./minute.

Structure-controlling thermal treatment can reduce distortion between interfaces in the integrated stacked material. As a result, although liquid crystal polymer films conventionally have difficulty in improvement in interlayer adhesion therebetween, it is possible to improve interlayer adhesion strength between liquid crystal polymer films. In addition, where the first temperature is higher than the melting point of the TLCP film in the thermo-bonding process, the film having a melting point lower than the first temperature reduces the crystallinity so as to contain an amorphous portion in part. However, by carrying out the structure-controlling thermal treatment at a specific temperature, probably because the amorphous portion can recrystallize by the structure-controlling thermal treatment, it is possible to improve heat resistance of the circuit board.

By the method explained above, the circuit board excellent in not only solder heat resistance but also interlayer adhesion can be produced. Further, the circuit board obtained by the method according to the present invention can have a smaller dimensional change rate relative to a raw film. Thus-obtained circuit board can be used after being subjected to a general technique for forming an electrical conduction path and also for mounting electronic parts.

Circuit Board

The circuit board according to the present invention is formed by the method explained above.

Figure 3:
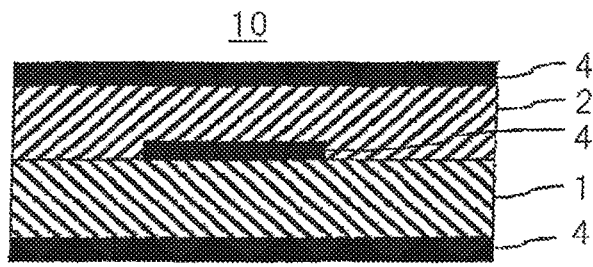
FIG. 3 is a schematic cross-sectional view of the multilayered circuit board according to one embodiment of the present invention.

FIG. 3 is a schematic cross-sectional view showing the basic structure of one embodiment of the circuit board according to the present invention. The multilayered circuit board 10 has a so-called bondingless structure which does not contain a bonding sheet. The multilayered circuit board 10 includes a first TLCP film 1, a second TLCP film 2, and a conductor layer (for example, a copper foil) 4. A circuit pattern is formed in the conductor layer 4 of the upper surface of the first TLCP film 1. If necessary, circuit may be formed also in the conductor layer 4 of the bottom surface of the first TLCP film 1, and in the conductor layer 4 of the upper surface of the second TLCP film 2. The first TLCP film 1 and the second TLCP film 2 may be the same TLCP films with the same melting point. Alternatively, they may be TLCP films having different melting points with each other. Although the FIG. 3 shows the structure containing two sheets of TLCP films, the multilayered circuit board may further contain one or more unit circuit boards, each having a TLCP film and a conductor layer formed on one surface of the film, and may further contain a coverlay (not shown) to be laminated together.

Figure 4:
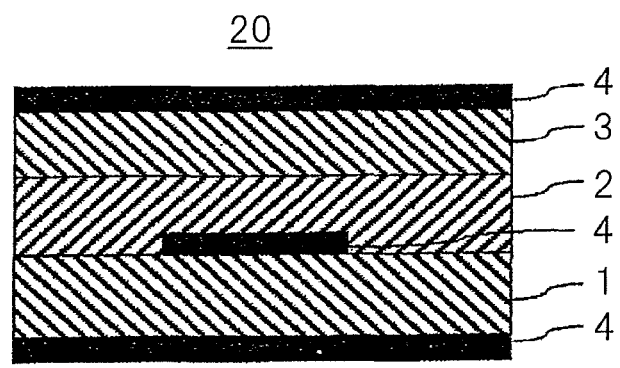
FIG. 4 is a schematic cross-sectional view of the multilayered circuit board according to another embodiment of the present invention.

FIG. 4 is a schematic cross-sectional view showing the basic structure of another embodiment of the circuit board according to the present invention. The multilayered circuit board 20 has a bonding structure containing a bonding sheet. The multilayered circuit board 20 includes a first TLCP film 1, a second TLCP film 2, a third TLCP film 3, and a conductor layer (for example, a copper foil) 4, and a circuit pattern is at least formed in the conductor layer on the upper surface of the first TLCP film 1. If necessary, circuit may be formed also in the conductor layer 4 of the bottom surface of the first TLCP film 1, and in the conductor layer 4 of the upper surface of the third TLCP film 3. The second TLCP film 2 has a melting point which is different from those of the first TLCP film 1 and the third TLCP film 3, and is used as a bonding sheet. The melting points of the first TLCP film 1 and the third TLCP film 3 may be the same, and may be different from each other. Although FIG. 4 shows the structure having three sheets of TLCP films, the multilayered circuit board may further contain one or more unit circuit boards, each having a TLCP film and a conductor layer formed on one surface of the film with or without a bonding sheet, and may contain a coverlay (not shown) to be laminated together.

Although not illustrated, a multilayered circuit board may be formed as another embodiment that combines the bondingless structure shown in FIG. 3 with the bonding structure as shown in FIG. 4.

Since the circuit board according to the present invention is produced by the method according to the present invention including the structure-controlling thermal treatment process, the circuit board according to the present invention is excellent in solder heat resistance and interlayer adhesion as well as excellent in dimensional stability.

EXAMPLES

Hereafter, The present invention will be described in detail with reference to Examples, however the present invention is not limited to these Examples. Various physical properties discussed in the Examples and Comparative Examples were measured by the following procedures.

Heat Resistance Test (Solder Heat Resistance)

A solder bath (288° C.) was used according to the solder float examination of IPC-TM-650 2.4.13. After cutting a sample (3 cm×3 cm) from a circuit board produced in Examples, the sample was placed in the solder bath for 60 seconds and took out from the bath. After peeling the first unit circuit board from the second unit circuit board between the film surface of the second unit circuit board and the circuit surface of the first unit circuit board, the existence of the unevenness in copper foil between layers was visually evaluated. Where unevenness was clearly observed by visual examination, the sample was determined as poor.

Where unevenness was not visually observed, further examination was carried out by peeling the first unit circuit board from the second unit circuit board between the film surfaces of the second unit circuit board and the first unit circuit board in contact to each other. Where abnormalities in appearance, such as expanding or dent, were not visually observed, the sample was determined as good.

Method for Measuring Bonding Strength Between Adjacent Circuit Board Materials

In conformity to JIS C 5016-1994, peel strength was measured by peeling one of two bonding circuit board materials from the other material at a peeling angle of 90° and at a peeling rate of 50 mm per minute using a tensile tester "Digital force gauge FGP-2" produced by NIDEC-SHIMPO CORPORATION. The obtained value was regarded as bonding strength (peeling strength).

Example 1

Onto each surface of a TLCP film having a melting point of 335° C. (Kuraray Co., Ltd., CT-Z, thickness: 50 µm), a rolled copper foil (JX Nippon Mining & Metals Corporation, BHYX-T-12, thickness: 12 µm) was set to be laminated, and using a vacuum hot press apparatus (heating board temperature: 300° C.), thermo-compression-bonding was carried out for 10 minutes under a pressure of 4 MPa to produce a first unit circuit board having a configuration of copper foil/TLCP film/copper foil.

Onto one surface of a TLCP film having a melting point of 285° C. (Kuraray Co., Ltd., CT-F, thickness: 50 µm), a rolled copper foil (JX Nippon Mining & Metals Corporation, BHYX-T-12, thickness: 12 µm) was set to be laminated, and using a vacuum hot press apparatus (heating board temperature: 275° C.), thermo-compression-bonding was carried out for 10 minutes under a pressure of 4 MPa to produce a second unit circuit board having a configuration of copper foil/TLCP film. Subsequently, circuit processing was carried out to the copper foil of one side of the first unit circuit board by the chemical etching method.

Subsequently, the film surface of the second unit circuit board was laminated on the circuit processing surface of the first unit circuit board so as to obtain a stacked material. The TLCP films (CT-Z, CT-F) used in the above-mentioned process of the stacked material had a square shape (30 cm×30 cm) in which one side is parallel to the MD direction of the film formation and the other side is parallel to the TD direction thereof. The MD direction (machine direction) is a running direction (rolling-up direction) of the film at the time of film processing, and the TD direction (transverse direction) is a perpendicular direction (cross direction of film) perpendicular to the MD direction. Lamination of the first unit circuit board and the second unit circuit board was carried out so that the MD directions and the TD directions of the up-and-down TLCP films were in the same directions with each other.

Thermo-compression-bonding and structure-controlling thermal treatment were carried out using a vacuum hot press apparatus. After carrying out preheating processing for 10 minutes at 150° C. under a pressure of 1.5 MPa and a vacuum degree of 1300 Pa, the temperature was elevated at a heating rate of 5° C./minute to 290° C. (the first temperature), and the first temperature (adhesion temperature) was kept for 30 minutes. Then, temperature was lowered to 265° C. (the second temperature) with a cooling rate at 5° C./minute, and structure-controlling thermal treatment was carried out for 60 minutes. After structure-controlling thermal treatment, the integrated stacked material was cooled to normal temperature, and pressure was released, then the vacuum vent was carried out so as to obtain a circuit board of Example 1.

Example 2

Except for changing the adhesion temperature for thermo-compression-bonding of a stacked material into 295° C., a circuit board of Example 2 was obtained using the same material and producing conditions as Example 1. In order to examine dimensional change rate, the second unit circuit board before lamination was subjected to marking by selecting a field (25 cm×25 cm) and pointing 25 marks (punched holes) in total with five rows in the MD direction and five rows in the TD direction. The interval of the opposed rows was 5 cm, and the punched holes in each row countered in the MD direction and the TD direction.

Example 3

Except for changing the adhesion temperature for thermo-compression-bonding of a stacked material into 300° C., a circuit board of Example 3 was obtained using the same material and producing conditions as Example 1.

Example 4

In the case that a circuit board of Example 4 is obtained using the same material and producing conditions as Example 1 except for subjecting a stacked material to degassing by heat-treating the stacked material at 100° C. under a pressing pressure of 0 MPa for 1 hour (the first degassing process:degassing process under heating), followed by heating the stacked material at 100° C. under a pressing pressure of 0 MPa and a vacuum of 1000 Pa for another 1 hour (the second degassing process:degassing process under heating), it is presumed that the circuit board has improved interlayer adhesion due to the degassing process, as well as improved solder heat resistance due to structure-controlling thermal treatment.

Comparative Example 1

Except for holding the adhesion temperature at 290° C. for 30 minutes and then cooling the integrated stacked material to ambient temperature without carrying out structure-controlling thermal treatment, a circuit board of Comparative Example 1 was obtained using the same material and producing conditions as Example 1.

Comparative Example 2

Except for holding the adhesion temperature at 295° C. for 30 minutes and then cooling the integrated stacked material to ambient temperature without carrying out structure-controlling thermal treatment, a circuit board of Comparative Example 2 was obtained using the same material and producing conditions as Example 2. In the second unit circuit board, marking was carried out before lamination in the same way as Example 2.

Comparative Example 3

Except for holding the adhesion temperature at 300° C. for 30 minutes and then cooling the integrated stacked material to ambient temperature without carrying out structure-controlling thermal treatment, a circuit board of Comparative Example 3 was obtained using the same material and producing conditions as Example 3.

Comparative Example 4

Except for holding the adhesion temperature at 290° C. for 30 minutes and then carrying out structure-controlling thermal treatment at 310° C., a circuit board of Comparative Example 4 was obtained using the same material and producing conditions as Example 1. Table 7 shows the heat treatment conditions of Examples 1 to 3 and Comparative Examples 1 to 4 in hot press apparatus.

TABLE 7

|  | Preheating | Bonding treatment | Thermal treatment for structure control |
|---|---|---|---|
| Ex. 1 | 150° C. 10 min. | 290° C. 30 min. | 265° C. 60 min. |
| Ex. 2 | 150° C. 10 min. | 295° C. 30 min. | 265° C. 60 min. |
| Ex. 3 | 150° C. 10 min. | 300° C. 30 min. | 265° C. 60 min. |
| Com. Ex. 1 | 150° C. 10 min. | 290° C. 30 min. | — |
| Com. Ex. 2 | 150° C. 10 min. | 295° C. 30 min. | — |
| Com. Ex. 3 | 150° C. 10 min. | 300° C. 30 min. | — |
| Com. Ex. 4 | 150° C. 10 min. | 290° C. 30 min. | 310° C. 60 min. |

A sample (0.5 cm×10 cm) was cut from each of the circuit boards in Examples 1 to 3 and Comparative Examples 1 to 4. In accordance with the above-described condition, the peel strength between the first unit circuit board and the second unit circuit board was measured. Another sample (3 cm×3 cm) was cut from each of the circuit boards, and the solder heat resistance test was carried out in accordance with the above-described method. Table 8 shows those results.

As for the circuit boards in Example 2 and Comparative Example 2, the dimensional change rate was evaluated as a ratio of the dimension after the compression-bonding (as for Example 2, after structure-controlling thermal treatment) relative to the dimension before compression-bonding. The dimensional change rates in the MD direction and the TD direction were obtained by measuring 25 interval lengths between each of the marking points in the MD direction and the TD direction, respectively, using three-dimensional measuring instrument, followed by calculating the average value for each of the directions. Subsequently, each sample was subjected to chemical etching using ferric chloride solution to remove copper foil on the outer layer (the top layer and the bottom layer of a circuit board), and then was washed and dried to complete the etching treatment.

Thereafter, by measuring intervals between holes in the MD direction and TD direction, respectively, the dimensional change rate was evaluated as a ratio of the dimension after etching treatment relative to the dimension before compression-bonding.

Subsequently, according to the IPC-TM-650 standard 2.24 method A, each circuit board sample was heated at 150° C. in an oven (FJ-630 by ADVANTEC) for 30 minutes. Thereafter, by measuring intervals between holes in the MD direction and TD direction, respectively, the dimensional change rate was evaluated as a ratio of the dimension after heating relative to the dimension before heating. Table 9 shows the above-mentioned results.

TABLE 8

|  | Peeling strength between layers kN/m | Solder Heat Resistance |
|---|---|---|
| Ex. 1 | 0.82 | Good |
| Ex. 2 | 0.98 | Good |
| Ex. 3 | 1.39 | Good |
| Com. Ex. 1 | 0.67 | Good |
| Com. Ex. 2 | 0.93 | Good |
| Com. Ex. 3 | 1.14 | Poor |
| Com. Ex. 5 | — | Poor |

TABLE 9

| | Dimensional change rate (%) | | | | | |
|---|---|---|---|---|---|---|
| | After compression bonding | | After etching | | After baking | |
| | MD | TD | MD | TD | MD | TD |
| Ex. 2 | 0.002 | 0.012 | −0.022 | −0.004 | −0.018 | 0.001 |
| Com. Ex. 2 | −0.023 | −0.014 | −0.054 | −0.049 | −0.043 | −0.075 |

Comparative Example 1 that was subjected to compression-bonding process at 290° C. showed comparatively low peel strength of 0.67 kN/m. On the other hand, Example 1 that was subjected to compression-bonding process at 290° C. and then structure-controlling thermal treatment showed improved peel strength exceeding 0.8 kN/m. Accordingly, it was confirmed that the interlayer adhesion was improved due to structure-controlling thermal treatment. Also in the contrast with Example 2 and Comparative Example 2, as well as the contrast with Example 3 and Comparative Example 3, the improvement in interlayer adhesion by structure-controlling thermal treatment was confirmed.

Although Comparative Example 3 that was subjected to compression-bonding process at 300° C. showed comparatively high peel strength, the result of the solder heat resistance test was poor. On the other hand, Example 3 that was subjected to compression-bonding process at 300° C. and then structure-controlling thermal treatment showed not only high peel strength but also satisfactory solder heat resistance.

Example 3 that was subjected to compression-bonding process at 295° C. and then structure-controlling thermal treatment showed the excellent dimensional stability. Even after baking (heat treatment for 30 minutes at 150° C.) for verifying dimensional change rate due to heat contraction after removing copper foil on the surface, the dimensional change rates before and after baking were small in both the MD direction and the TD direction. On the other hand, in Comparative Example 2 used for comparing the dimensional change rate as reference, relatively large dimensional change was observed both before and after removing surface copper foil, and before and after baking in the TD direction and the MD direction. Improvement in dimensional stability in Examples can be construed as caused by reduction of distortion in the bonding interface due to structure-controlling thermal treatment.

Comparative Example 4 was subjected to structure-controlling thermal treatment at 310° C. which is a temperature higher than 285° C. of a minimum melting point of the thermoplastic liquid crystal polymer among the used TLCP films. In Comparative Example 4, resin flow occurred, and also expansion occurred in the solder float examination so that solder heat resistance was not satisfactory. Comparing with Example 1, it is presumed that solder heat resistance is affected by the temperature in the structure-controlling thermal treatment process, and that the crystallinity of the TLCP film having the lowest melting point among the films is deteriorated due to the process temperature higher than the melting point thereof so as to cause inferior solder heat resistance.

Preferred embodiments of the present invention are shown and described. It is to be understood that various changes, modifications and omissions may be made without departing from the spirit of the present invention and are encompassed in the scope of the claims.

What is claimed is:

1. A method of producing a circuit board, the method comprising:
   preparing a plurality of at least one kind of thermoplastic liquid crystal polymer films;
   preparing at least one unit circuit board by forming a conductor layer on one side or both sides of at least one film out of the plurality of films;
   laminating the at least one unit circuit board and the at least one unit circuit board, or at least one film out of the plurality of films and the at least one unit circuit board to obtain a stacked material; and
   conducting thermo-compression-bonding of the stacked material under pressurization to a first temperature giving (i) adhesion between the at least one unit circuit board and the at least one unit circuit board, (ii) adhesion between the at least one unit circuit board and the at least one film out of the plurality of films, or (iii) adhesion both (i) and (ii) to integrate the stacked material, thereby obtain an integrated stacked material,
   wherein the thermo-compression-bonding process comprises a structure-controlling thermal treatment of heating the integrated stacked material while pressurizing for a predetermined period at a second temperature which is lower than the first temperature and is lower than the melting point of a thermoplastic liquid crystal polymer film having the lowest melting point out of the plurality of the at least one kind of thermoplastic liquid crystal polymer films, to obtain a circuit board.

2. The production method of the circuit board according to claim 1, wherein where the thermoplastic liquid crystal polymer film having the lowest melting point out of the plurality of the at least one kind of thermoplastic liquid crystal polymer films in the stacked material has a melting point of TmL, the thermo-compression-bonding is carried out at a first temperature of (TmL−35)° C. to (TmL+20)° C., and/or the structure-controlling thermal treatment is carried out at a second temperature that is equal to or lower than the temperature of 10° C. lower than the first temperature.

3. The production method of the circuit board according to claim 1, wherein the structure-controlling thermal treatment at the second temperature is carried out for 15 minutes to 90 minutes.

4. The production method of the circuit board according to claim 1, wherein from the first temperature to the second temperature, cooling is carried out at a cooling rate of PC/minute to 8° C./minute.

5. The production method of the circuit board according to claim 1, wherein the first temperature for thermo-compression-bonding is 270 to 320° C., and the second temperature for structure-controlling thermal treatment is 260 to 290° C.

6. The production method of the circuit board according to claim 1, wherein the stacked material has a part in which a unit circuit board of a thermoplastic liquid crystal polymer film and a conductor layer formed on one surface or both surfaces of the thermoplastic liquid crystal polymer film is directly bonded to another unit circuit board of a thermoplastic liquid crystal polymer film and a conductor layer formed on one surface or both surfaces of the thermoplastic liquid crystal polymer film.

7. The production method of the circuit board according to claim 1, wherein the stacked material has a part in which a bonding sheet of a they liquid crystal polymer film is interposed between two unit circuit boards each of which having a thermoplastic liquid crystal polymer film and a conductor layer formed on one surface or both surfaces thereof.

8. The production method of the circuit board according to claim 1, wherein the conductor layer is formed on at least one side of a thermoplastic liquid crystal polymer film by thermo-compression-bonding a metallic foil to the thermoplastic liquid crystal polymer film.

9. The production method of the circuit board according to claim 1, further comprising:
   carrying out a degassing process under at least one of the following conditions:
      for a predetermined period under heating at a temperature ranging from 100° C. to 200° C. under atmospheric or inert gas, and
      for a predetermined period under vacuum of 1500 Pa or lower,
   wherein the degassing process occurs in at least one stage selected from the group consisting of:
      a stage after preparing a thermoplastic liquid crystal polymer film and before forming a conductor layer thereon,
      a stage after forming a conductor layer on one surface or both surfaces of the thermoplastic liquid crystal polymer film, and before forming a stacked material, and
      a stage after forming the stacked material and before the theimo-compression-bonding.

10. A circuit board produced by the method recited in claim 1, which has a lamination structure of a plurality of thermoplastic liquid crystal polymer films and at least one conductor layer to be processed into a circuit, the lamination structure including at least a part in which the circuit-processed conductor layer is interposed between the two sheets of the thermoplastic liquid crystal polymer films.

* * * * *